(12) United States Patent
Pendharkar et al.

(10) Patent No.: US 6,395,593 B1
(45) Date of Patent: May 28, 2002

(54) METHOD OF MANUFACTURING HIGH SIDE AND LOW SIDE GUARD RINGS FOR LOWEST PARASITIC PERFORMANCE IN AN H-BRIDGE CONFIGURATION

(75) Inventors: Sameer Pendharkar, Plano; Taylor R. Efland, Richardson, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/550,746

(22) Filed: Apr. 17, 2000

Related U.S. Application Data

(60) Provisional application No. 60/132,840, filed on May 6, 1999.

(51) Int. Cl.[7] .......................................... H01L 21/8238
(52) U.S. Cl. ...................................... 438/207; 438/355
(58) Field of Search ................................ 438/353–357, 438/416; 257/584, 587, 593, 526

(56) References Cited

U.S. PATENT DOCUMENTS

| | | | | |
|---|---|---|---|---|
| RE36,311 E | * | 9/1999 | Frisina et al. | 438/133 |
| 6,124,751 A | * | 9/2000 | Pidutti | 327/424 |
| 6,225,181 B1 | * | 5/2001 | Gregory | 438/355 |

* cited by examiner

*Primary Examiner*—David Nelms
*Assistant Examiner*—Dung A Le
(74) *Attorney, Agent, or Firm*—Carlton H. Hoel; Wade James Brady III; Frederick J. Telecky, Jr.

(57) ABSTRACT

A method of minimizing parasitics in an MOS device caused by the formation of a bipolar transistor within the MOS devices and the device, primarily for a polyphase bridge circuit. For the low side device, a substrate of a first conductivity type is provided having a first buried layer of opposite conductivity type thereon. A second buried layer of the first conductivity type is formed over the first buried layer and a further layer of the first conductivity type is formed over the second buried layer. A sinker extending through the further layer to the first buried layer is formed to isolate the second buried layer and the further layer from the substrate. Formation of an MOS device in the further layer including source, drain and gate regions is completed and the sinker is connected to a source terminal of the device. The second buried layer is formed either by coimplanting a p-type dopant and an n-type dopant with one of the dopant having a higher diffusion rate than the other or by implanting and diffusing one of the two dopants first to form one layer and then implanting and diffusing the other dopant to form the second layer. The preferred dopants are boron as the p-type dopant and antimony as the n-type dopant.

15 Claims, 5 Drawing Sheets

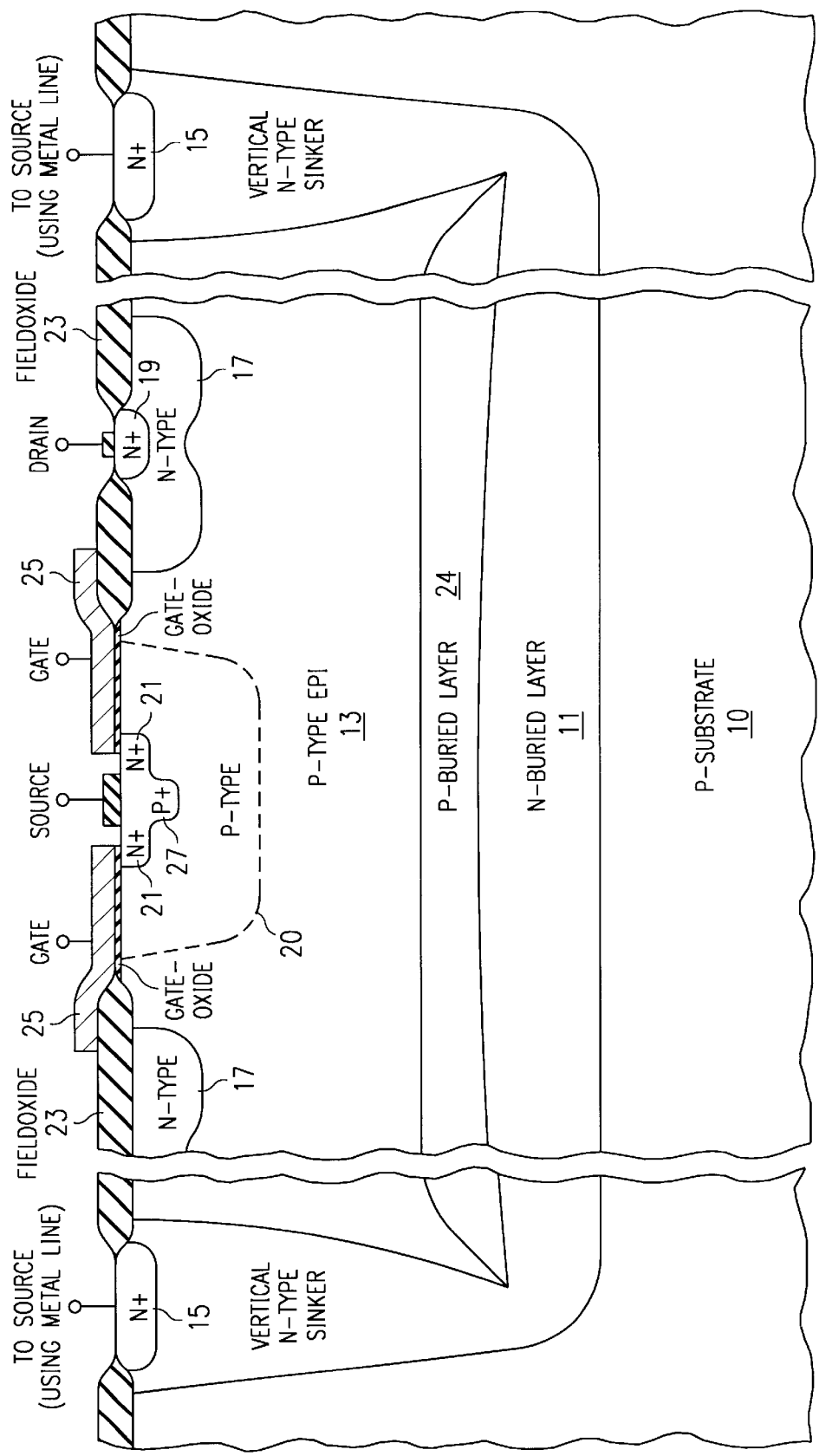

METHOD OF MANUFACTURING HIGH SIDE AND LOW SIDE GUARD RINGS FOR LOWEST PARASITIC PERFORMANCE IN AN H-BRIDGE CONFIGURATION

This application claims priority under 35 USC 119(e)(1) of provisional application No. 60/132,840 filed May 6, 1999.

BACKGROUND OF THE INVENTION

1. Field of the Invention

This invention relates to a method for reducing the effect of the parasitic bipolar transistor formed in both high-side and low side LDMOS devices in a multi-phase or polyphase bridge configuration.

2. Brief Description of the Prior Art

A standard H-bridge configuration as shown in FIG. 1 is a circuit for a single phase having at least a first pair of transistors 1, 3 coupled in series and coupled across a power supply having a power rail (+) and a ground rail (−) and a second pair of transistors 5,7 coupled in series and coupled across the same power supply with a load 9 being coupled between the junctions of the transistors of each transistor pair. The transistor of each transistor pair which is coupled to the power rail (+) is referred to as the high side device and the other transistor of each transistor pair which is coupled to the ground rail (−) is referred to as the low side device. In the event plural phases are required, an additional transistor pair is provided for each phase as is well known and shown in phantom in FIG. 1.

With reference to FIG. 2, there is shown an implementation of either one of the transistors of a transistor pair in the circuit of FIG. 1 as an integrated circuit. The circuit is known as a polyphase bridge circuit and the switches generally used are known as reduced surface electric field (RESURF) DMOS transistor/switches, though any type of switch can be used, this application being specific to RESURF DMOS as switches. The circuit includes an n-type buried layer 11 over a p--type substrate 10 beneath a p-type epitaxial layer 13 into which the transistors are fabricated. The n-type buried layer 11 provides isolation between the transistor thereabove and other transistors on the same chip in conjunction with an n-type sinker or back gate contact 15 which is provided and which passes from the device surface through the epitaxial layer 13 to the buried layer 11. An n-type well region 17 is formed in a part of the epitaxial layer extending to the surface with the remainder of the surface remaining p-type. An n+ contact 19 is provided in the n-type well 17 to provide a drain region and an n+ type region 21 is formed at the surface of the p-well region 20 within the p-type region 13 to provide a source contact and region. An oxide layer 23 is deposited over a portion of the n+ contact 19 and a part of the well region 17 with a polysilicon gate 25 formed over a portion of the n+ source contact 21, the well region 17, any remaining unexposed portion of the well region 17 along the channel and over a portion of the oxide layer. The p+ region 27 within the n-type region 21 is present to provide a backgate contact which is the contact to the p-type region 13.

A problem with the structure as shown in FIG. 2 is that bipolar transistor structures are present in addition to the LDMOS transistors, the bipolar transistors providing parasitics in both the high side and low side LDMOS transistors. In the high side device, there is a pnp transistor between the p-type epitaxial layer 13, the n-type buried layer 11 and the p-type substrate 10 on which the buried layer rests as well as an npn transistor between the n-type drain 17, the p-type epitaxial layer 13 and the n-type buried layer 11. In the low side device, there is a pnp transistor between the p-type epitaxial layer 13, the n-type buried layer 11 and the p-type substrate 10 as well as an npn transistor between n-type drain 17, the p-type epitaxial layer 13 and the n-type buried layer 11. It is these transistors which provide the above-discussed undesirable parasitics

SUMMARY OF THE INVENTION

In order to minimize parasitics, the parasitic devices, which are the bipolar transistor configurations, are connected in a manner whereby they do not affect the H-bridge circuit operation in any major way. It is always desirable that these parasitic devices be of as poor quality as possible, this meaning that the gain of these parasitic bipolar transistors should be as low as possible without sacrificing the "optimization" of the main devices of the H-bridge circuit.

In accordance with the present invention, the above noted problem is minimized with the effect of parasitics being reduced relative to the prior art H-bridge structure.

"Briefly, the improvement is provided by altering the prior art circuit of FIG. 2 with the incorporation of a double buried layer having an n-type buried layer region as in the prior art as well as a p-type buried layer region over the n-type buried layer region, this being for both high side and low side devices and providing an n-type sinker to the n-type buried layer and connecting the sinker/n-type buried layer to the source terminal for the device. This means that, for a high side device, the sinker/n-type buried layer will be connected to one end of the load and, for the low side device, the sinker/n-type buried layer will be connected to the negative terminal of the power supply. In the prior art, the sinker is coupled to the drain in the high side devices. In accordance with the present invention, the sinker is connected to the source for both the high side and low side devices to decrease the bipolar parasitic effects.

In this case, the high side devices have to have their own n+ vertical diffusion for isolation. The advantage of this type of connection for the high side is that a p-type epitaxial substrate can be used because the pnp transistor to the substrate will have a $V_{be}$=0 and will never be active. Also, the design of high side and low side devices as far as coimplanted or double diffused p-type buried layer is concerned is identical. The effect of parasitics in the low side LDMOS devices is to tie the n+ buried layer of FIG. 2 to the source via the sinker with the source being connected to ground and also to have a double-diffused (or coimplanted) p+ buried layer. The sinker is provided by a vertical n+ deposition which also separates the p-type epitaxial layer of the two devices of a transistor pair to reduce the gain of the bipolar transistor formed between the drains of the two low side devices. The gain of this bipolar junction transistor (BJT) can be high due to neutral base width reduction which is more especially for high voltage devices at high voltages. This vertical n+ deposition diffuses into the underlying n+ buried layer and is connected to the source, which is grounded.

It should be understood that all of the vertical depositions forming the sinker surround the entire device, both low side and high side. This arrangement is present to reduce crosstalk between adjacent devices by reducing the gain of the parasitic bipolar transistors formed between adjacent devices and between the DMOS device and other circuitry.

The above described method of laying out an H-bridge with a double diffused or coimplanted p+ buried layer for low side and high side devices and the isolation using properly connected n+ layers is novel and has not been considered in prior analyses of the above noted problem. Furthermore, the addition of a second buried layer of opposite conductivity type to the standard buried layer of the prior art and between the standard buried layer of the prior art and the epitaxial layer of opposite conductivity type over the buried layer, which is more heavily doped than the epitaxial layer, aids in reduction of the bipolar gain of the transistor formed between the buried layer of the prior art, the epitaxial layer thereover of the prior art and the source/drain region of the same conductivity as the buried layer of the prior art and is hence beneficial. Other advantages of the above described solution to the problem of parasitics are reduced die area requirement for isolation of the devices in an H-bridge configuration, reduced effect of the parasitic bipolar devices (including reduced gain) on the operation of the main circuit and cost reduction due to elimination of the need of a p+ substrate (a p-epitaxial wafer is sufficient).

BRIEF DESCRIPTION OF THE DRAWINGS

FIG. 2a shows a general RESURF DMOS cross section in accordance with the present invention;

FIG. 3 shows the low side device with the topography near the surface not shown in detail, it being understood that the omitted topography is the same as in FIG. 2a; and FIG. 4 shows the high side device with the topography near the surface not shown in detail, it being understood that the omitted topography is the same as in FIG. 2a.

DESCRIPTION OF THE PREFERRED EMBODIMENTS

Figure 1:
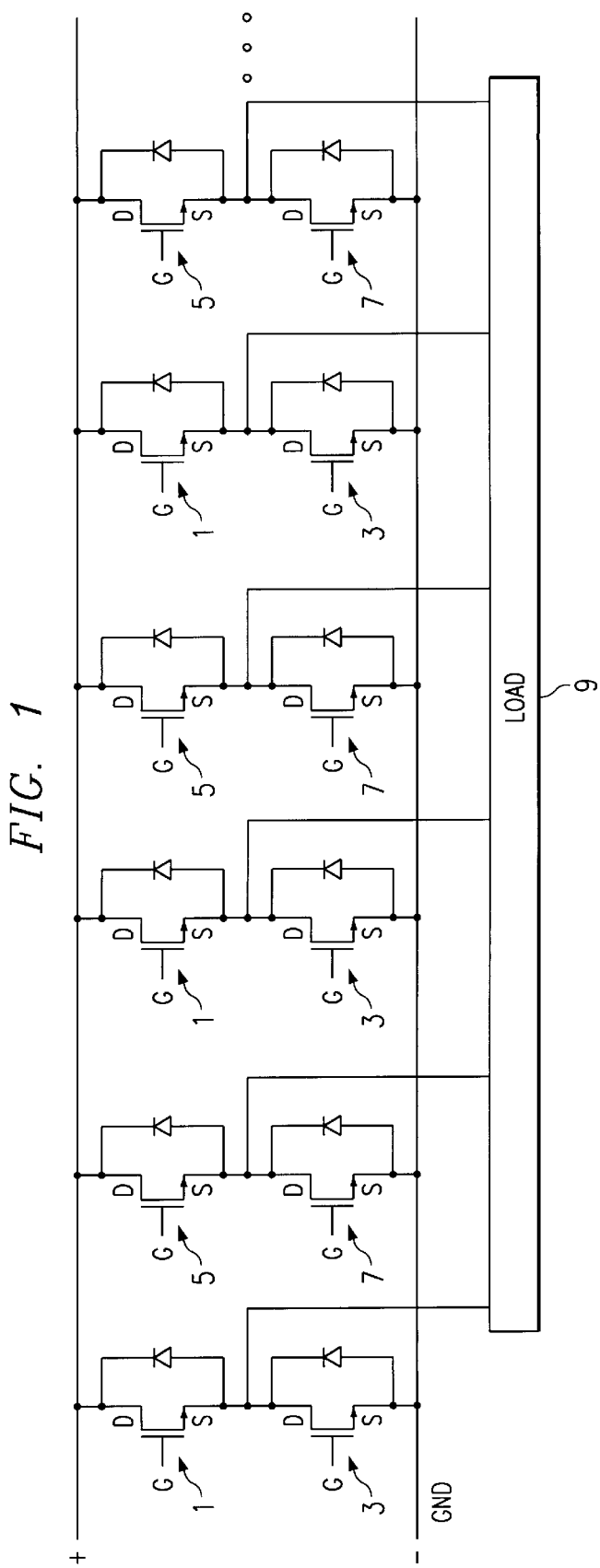
FIG. 1 is a circuit diagram of a poly phase bridge circuit in accordance with the prior art.
Figure 2:
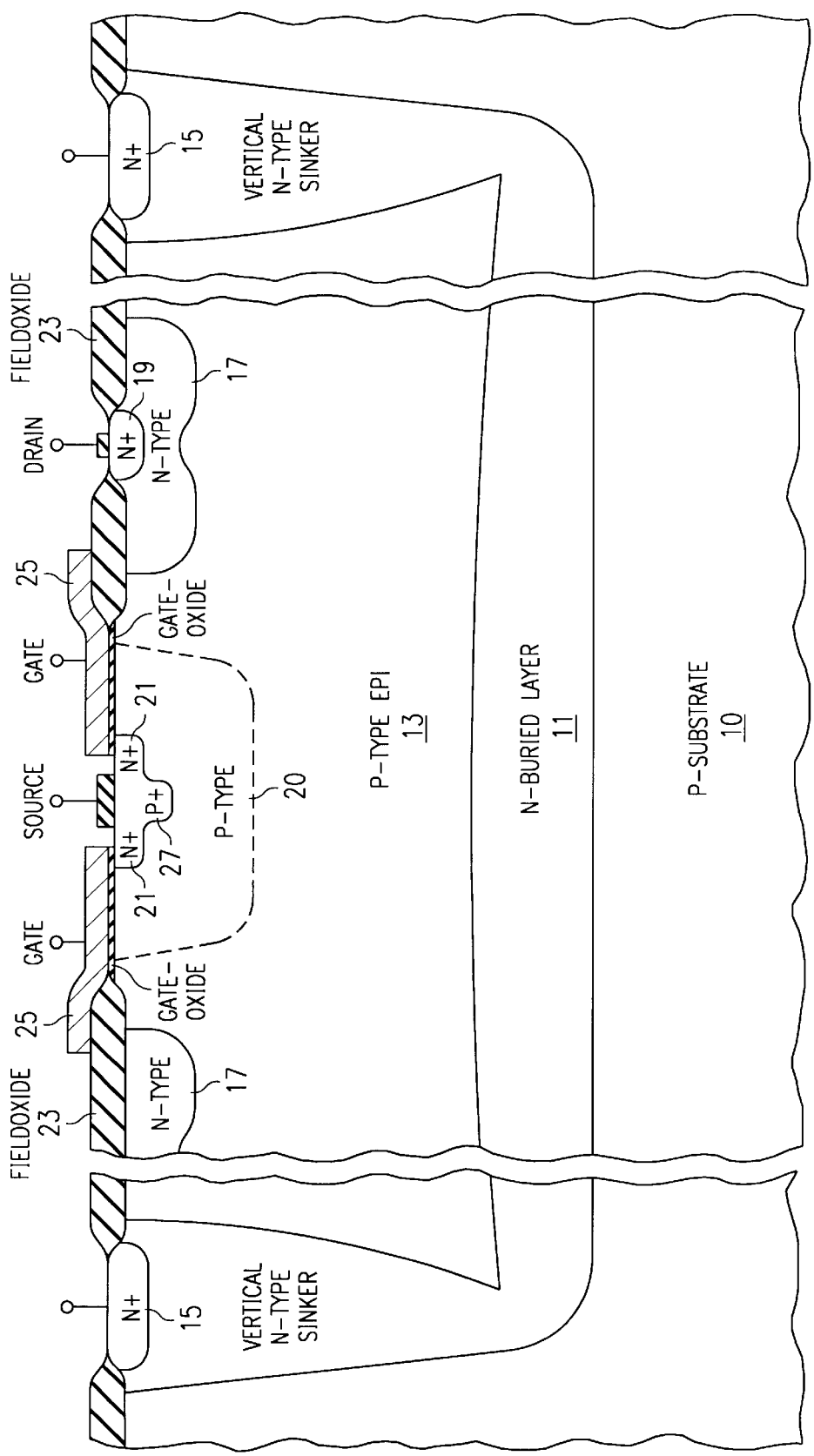
FIG. 2 shows a general RESURF DMOS cross section in accordance with the prior art.

With reference to FIGS. 2 (prior art) and 2a (preferred embodiment) which includes the improvements in accordance with the present invention, the above described improvements are provided in the high side and low side LDMOS devices by providing and tying the sinker 15/n-type buried layer 11 to the source terminal 21 of the device using the metal system. It should be understood that the sinker is coupled to the source in both the high side and low side devices using the metal interconnect system. In an H-bridge configuration, the drain terminal 19 of the high side device is connected to the positive terminal (+) of the power supply and the source terminal 21 is connected to the load whereas, for the low side device, the drain terminal 19 is connected to the load whereas the source terminal 21 is connected to the negative terminal (−) of the power supply (also termed ground herein). In this case, the high side devices have to have their own n+ vertical diffusion for isolation. The advantage of this type of connection for the high side is that a p-type epitaxial substrate can be used because the pnp transistor to the substrate will have a $V_{be}=0$ and will never be active. Also, the design of high side and low side devices as far as coimplanted or double diffused p-type buried layer 24 is concerned is identical. The effect of parasitics in the low side LDMOS devices is to tie the n+ buried layer 11 of FIG. 2a to the source 21 via the sinker 15 with the source being connected to ground and also to have a double-diffused (or coimplanted) p+ buried layer 24. The sinker 15 is provided by a vertical n+ deposition which also separates the p-type epitaxial layer 13 of the two devices of a transistor pair to reduce the gain of the bipolar transistor formed between the drains of the two low side devices. The gain of this bipolar junction transistor (BJT) can be high due to neutral base width reduction which is more especially for high voltage devices at high voltages. This vertical n+ deposition diffuses into the underlying n+ buried layer and is connected to the source 21 which is grounded.

It should be understood that all of the vertical depositions 15 surround the entire device, both low side and high side. This arrangement is present to reduce crosstalk between adjacent devices by reducing the gain of the parasitic bipolar transistors formed between adjacent devices and between the DMOS device and other circuitry.

The above described method of laying out an H-bridge with a double diffused or coimplanted p+ buried layer for low side and high side devices and the isolation using properly connected n+ layers is novel and has not been considered in prior analyses of the above noted problem. Furthermore, the addition of a second buried layer of opposite conductivity type to the standard buried layer of the prior art and between the standard buried layer of the prior art and the epitaxial layer of opposite conductivity type over the buried layer which is more heavily doped than the epitaxial layer aids in reduction of the bipolar gain of the transistor formed between the buried layer of the prior art, the epitaxial layer thereover of the prior art and the source/drain region of the same conductivity as the buried layer of the prior art and is hence beneficial. Other advantages of the above described solution to the problem of parasitics are reduced die area requirement for isolation of the devices in an H-bridge configuration, reduced effect of the parasitic bipolar devices (including reduced gain) on the operation of the main circuit and cost reduction due to elimination of the need of a p+ substrate (a p-epitaxial wafer is sufficient).

Though the discussion throughout is provided with reference to a p-type substrate and n-channel devices, it should be understood that the invention also applies to opposite conductivity type devices with all polarities reversed as is well known in the art.

Figure 3:
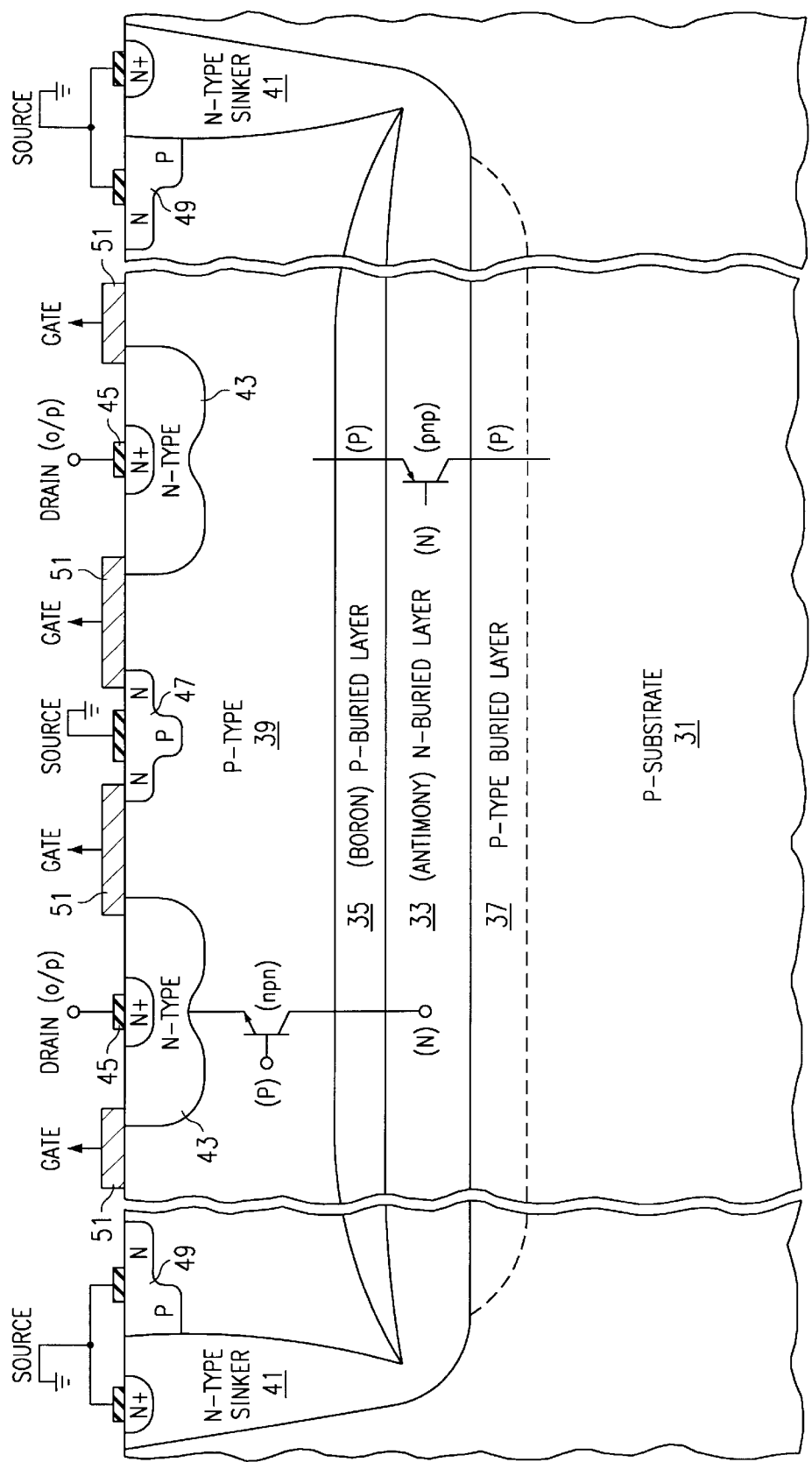

Referring to FIG. 3, there is shown a diagram of two fingers of the many fingers present in one low side plural fingered device structure wherein two low side transistors are shown connected in parallel having a common drain electrode to provide increased power in accordance with the present invention, it being understood that only one such transistor can be used. The two transistors are similar if not identical. It should further be noted (though not shown in the drawings) that each transistor is generally designed to have a plurality of fingers which are alternately source regions and drain regions to provide many single source/drain transistors connected in parallel with all sources tied together and all drains tied together. Each low side transistor includes a p-type substrate 31 over which is a buried n-type layer 33 with a buried p-type layer 35 thereover. The layers 33 and 35 are formed by successive formation of the n-type layer 33 followed by the p-type layer 35 in standard manner or, alternatively, there can be a coimplant of a p-type and n-type dopant wherein the p-type dopant is capable of more rapid diffusion than the n-type dopant. In the case of the coimplant, the net dopant in the layer 33 is n-type whereas the p-type layer 35 and a p-type region 37 in the substrate 31 (shown in phantom) is formed. The dopants can be, for example, boron and antimony for the p-type and n-type dopants respectively with boron diffusing much more rapidly than does antimony. Otherwise the structure is the same as in the prior art as discussed above with reference to FIG. 2 with a p-type epitaxial layer 39 into which the transistors are fabricated. An n-type sinker 41 is provided which passes from the device surface through the epitaxial layer 39 to the buried n-type layer 33. The sinker 41 will be present near the outermost fingers only in the case of the above described alternating finger arrangement. An n-type well region 43 is formed in a part of the epitaxial layer extending to the surface with the remainder of the surface remaining p-type. An n+ contact 45 is provided in the n-type well 43 to provide a drain region and an n-type region 47 is formed at the surface of the epitaxial layer 39 to provide a source contact and region 49. A gate electrode 51 is disposed over and spaced by a dielectric (not shown) from the channel between the source 49 and drain 45 electrodes and can extend partially over one or both of these electrodes. The buried layer 33 is tied to the source 49 through the sinker 41.

As can be seen, the npn transistor formed among the regions 43, 39 and 33 is either in the cut off mode or when it is not in the cut off mode, the voltage across the base-collector of this npn transistor is zero. With reference to the pnp transistor formed among regions 31, 33 and 35, all of the terminals are grounded. Accordingly, parasitics developed in the low side transistor due to bipolar transistor formation therein are minimized.

Figure 4:
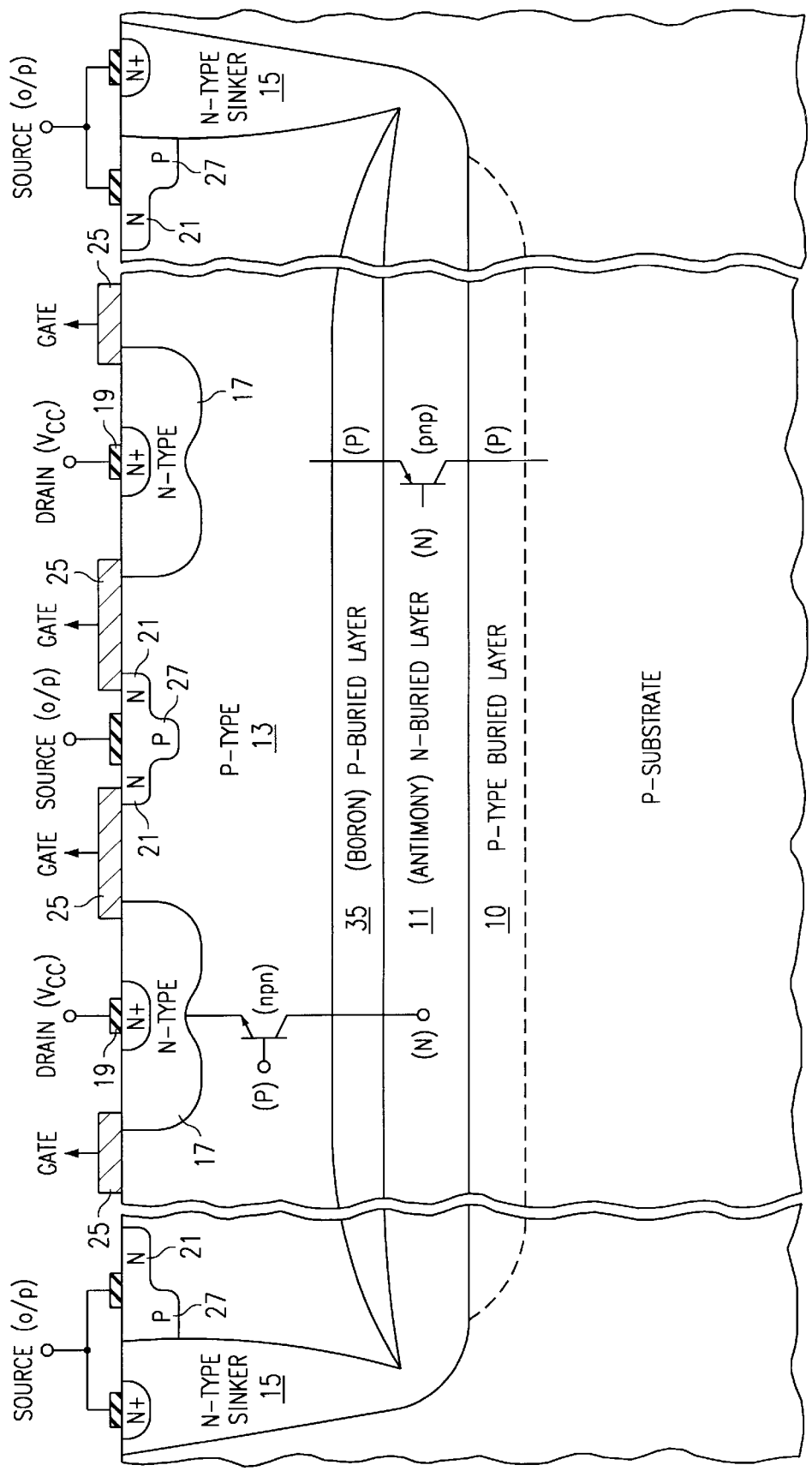

Referring to FIG. 4, there is shown an embodiment of two fingers of the many fingers present in one high side plural fingered device structure wherein a pair of high side transistors are connected in parallel as in FIG. 3 in accordance with the present invention. The same or similar structure to that of FIG. 2a except that the p-type buried layer 35 as shown in FIG. 3 is added, the source region 27 is isolated by a vertical n+ region 21 and the sinker 15 is tied to the source region. In this embodiment, the npn transistor formed among the n-type drain, the p-type epitaxial layer and the n-type buried layer is cut off or $V_{CB}$ is zero and the pnp transistor formed among the p-type epitaxial layer, the n-type buried layer and the p-type substrate has $V_{BE}$ at zero.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of minimizing parasitics in an MOS device caused by the formation of a bipolar transistor within the MOS device which comprises the steps of:
   (a) providing a substrate of a first conductivity type having a first buried layer of opposite conductivity type thereon;
   (b) forming a second buried layer of said first conductivity type over said first buried layer;
   (c) forming a further layer of said first conductivity type over said second buried layer;
   (d) forming source and drain regions in said further layer; and
   (e) forming a sinker coupled to said source region and extending through said further layer to said first buried layer to isolate said second buried layer and said further layer from said substrate.

2. The method of claim 1 wherein said first and second buried layers are formed by coimplanting a p-type dopant and an n-type dopant with one of said dopants having a higher diffusion rate than the other.

3. The method of claim 2 wherein said p-type dopant has a higher diffusion rate than the n-type dopant.

4. The method of claim 3 wherein said p-type dopant is boron and said n-type dopant is antimony.

5. The method of claim 1 wherein said first and second buried layers are formed by implanting a dopant of a first conductivity type followed by implanting a dopant thereover of a second conductivity type.

6. The method of claim 5 wherein said dopant of a first conductivity type is n-type and said dopant of said second conductivity type is p-type.

7. The method of claim 6 wherein said p-type dopant is boron and said n-type dopant is antimony.

8. A method of forming an H-bridge circuit configuration which comprises the steps of:
   (a) providing a high side MOS transistor and a low side MOS transistor coupled in series, the drain of the high side transistor couplable to a relatively high voltage source and the source of the low side transistor couplable to a voltage source having a lower voltage than said relatively high voltage source, the junction of said high side and low side transistor being couplable to a load; and
   (b) for each of said high side and low side transistors:
      (i) providing a substrate of a first conductivity type having a first buried layer of opposite conductivity type thereon;
      (ii) forming a second buried layer of said first conductivity type over said first buried layer;
      (iii) forming a further layer of said first conductivity type over said second buried layer;
      (iv) forming source and drain regions in said further layer; and
      (v) forming a sinker coupled to said source region and extending through said further layer to said first buried layer to isolate said second buried layer and said further layer from said substrate.

9. The method of claim 8 further comprising the step of providing a power source having a relatively high voltage terminal coupled to said drain of said high side transistor and having a terminal having a lower voltage than said relatively high voltage source coupled to said source of said low side transistor.

10. The method of claim 9 further comprising the step of providing a load and coupling the junction of said high side and low side transistors to said load.

11. The method of claim 8 further comprising the step of providing a load and coupling the junction of said high side and low side transistors to said load.

12. The method of claim 8 further comprising the step of providing a plurality of said pairs of high said and low side transistors couplable in parallel across a power source and having the junction of said high side and low side transistors couplable to said load.

13. The method of claim 12 further comprising the step of providing said power source having a relatively high voltage terminal coupled to said drain of said high side transistor and having a terminal having a lower voltage than said relatively high voltage source coupled to said source of said low side transistor.

14. The method of claim 13 further comprising the step of providing said load and coupling the junction of said high side and low side transistors to said load.

15. The method of claim 12 further comprising the step of providing said load and coupling the junction of said high side and low side transistors to said load.

* * * * *